United States Patent
Lee

(10) Patent No.: US 7,317,629 B2
(45) Date of Patent: Jan. 8, 2008

(54) SEMICONDUCTOR MEMORY DEVICE WITH SIMPLIFIED DATA CONTROL SIGNALS

(75) Inventor: Chang-Hyuk Lee, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 376 days.

(21) Appl. No.: 11/044,976

(22) Filed: Jan. 26, 2005

(65) Prior Publication Data

US 2006/0092714 A1    May 4, 2006

(30) Foreign Application Priority Data

Oct. 29, 2004    (KR) .................. 10-2004-0087326

(51) Int. Cl.
G11C 7/00    (2006.01)
(52) U.S. Cl. ................. 365/51; 365/63; 365/191; 365/193
(58) Field of Classification Search ............. 365/51, 365/63, 191, 193
See application file for complete search history.

(56) References Cited

U.S. PATENT DOCUMENTS

| 5,923,595 | A | 7/1999 | Kim |
|---|---|---|---|
| 6,154,418 | A | 11/2000 | Li |
| 6,229,757 | B1 | 5/2001 | Nagata et al. |
| 6,397,312 | B1 * | 5/2002 | Nakano et al. ............. 711/167 |
| 6,519,188 | B2 | 2/2003 | Ryoo et al. |
| 6,708,264 | B1 | 3/2004 | Abe et al. |
| 6,785,168 | B2 | 8/2004 | Yoon |
| 6,813,249 | B1 | 11/2004 | Lauffenburger et al. |
| 2005/0047222 | A1 * | 3/2005 | Rentschler .................. 365/193 |

FOREIGN PATENT DOCUMENTS

| JP | 2000-357392 | 12/2000 |
|---|---|---|
| JP | 2001-166989 | 6/2001 |
| JP | 2001-236782 | 8/2001 |

* cited by examiner

Primary Examiner—Jack Lane
(74) Attorney, Agent, or Firm—Blakely, Sokoloff, Taylor & Zafman

(57) ABSTRACT

A semiconductor memory device for reducing data line length includes a plurality of data input strobe signal generation units each of which for generating a plurality of data input strobe signals based on a plurality of data input control code signals; and a plurality of data coders one-to-one corresponded to the plurality of data input strobe signal generation units for outputting data to a plurality of global input/output lines according to the plurality of data input strobe signals.

7 Claims, 3 Drawing Sheets

SEMICONDUCTOR MEMORY DEVICE WITH SIMPLIFIED DATA CONTROL SIGNALS

FIELD OF INVENTION

The present invention relates to a semiconductor memory device; and, more particularly, to a semiconductor memory device with a reduced size having simplified data control signals.

DESCRIPTION OF PRIOR ART

Generally, a semiconductor memory device receives data inputted in series from an external circuit through a data input/output pad. The received data are passed through a prefetch unit to be loaded on a plurality of data lines in parallel. Then, the data loaded on the plurality of data lines are transferred to a memory core region through a plurality of global input/output (GIO) lines. Herein, for improving a drivability of transferring the data to the memory core, a data coding unit is employed for receiving the data loaded on the plurality of data lines and outputting the data to the plurality of global input/output lines with en enhanced drivability.

Herein, the data coding unit is required to differently match the data of the plurality of data lines to the plurality of global input/output lines according to a burst type and a starting address. That is, the burst type has generally two different type, i.e., one is a sequential method and the other is an interleaving method, and the data of the plurality of data lines are differently matched to the plurality of global input/output lines according to the burst type and the starting address. For this purpose, a data input strobe signal generator is employed for generating a plurality of control signals for controlling the data coding unit.

The above-mentioned different matching between the data and the global input/output lines according to the burst type and the starting address is illustrated in following Table. 1. Herein, it is assumed that a burst length is 4.

synchronization with a rising edge of a first clock cycle of a clock signal, and a first data and a second data are inputted in synchronization with a rising edge and a falling edge of a second clock cycle of the clock signal. Then, from a third clock cycle of the clock signal, data according to the burst length are inputted at every rising edge and falling edge of the clock signal.

The data inputted in synchronization with the clock signal are sequentially passed through a data pin to be loaded on four internal registers. For example, a first and a fifth data are loaded on a first internal register; a second and a sixth data are loaded on a second internal register; a third and a seventh data are loaded on a third internal register; and a fourth and an eighth data are loaded on a fourth internal register.

The data loaded on the first to the fourth internal registers are respectively loaded on four data nodes, i.e., a first to a fourth data node, in synchronization with the clock signal. For example, the first to the fourth data are loaded on a first to a fourth data nodes in synchronization with a falling edge of the second clock cycle of the clock signal and the fifth to the eighth data are loaded on the first to the fourth data nodes in synchronization with a falling edge of the fourth clock cycle of the clock signal. Herein, the four data nodes are input nodes of the data coding unit.

In case of the conventional DDR2 SDRAM, four global input/output lines, i.e., a first to a fourth global input/output lines, are corresponded to one data pin.

Meanwhile, a matching method between the data loaded on the first to the fourth data nodes and the first to the fourth global input/output lines gio_0 to gio_3 is determined based on two least significant bits of the column address and the burst type.

According to the prior art, a data input control code signal generator is employed for generating a first data input control code signal soseb0_wt and a second data input control code signal seseb1_wt by shifting the two least significant bits, i.e., a0 and a1, by amount of clock cycles of

TABLE 1

| | Burst Type | | | | | | | |
|---|---|---|---|---|---|---|---|---|
| | Sequential (decimal) | | | | Interleave (decimal) | | | |
| | Starting Address | | | | | | | |
| | 0 | 1 | 2 | 3 | 0 | 1 | 2 | 3 |
| Sequence of GIO line | 0, 1, 2, 3 | 1, 2, 3, 0 | 2, 3, 0, 1 | 3, 0, 1, 2 | 0, 1, 2, 3 | 1, 0, 3, 2 | 2, 3, 0, 1 | 3, 2, 1, 0 |

The data coding unit matches the data to the global input/output lines according to the burst type and the starting address as shown in Table. 1. Herein, the above-mentioned operation of the data coding unit is controlled by the plurality of control signals generated by the data input strobe signal generator.

The above-mentioned operations of a semiconductor memory device are described below particularly referring to a write operation of a conventional double data rate 2 synchronous dynamic random access memory (DDR2 SDRAM).

For the write operation, a write command and a column address are inputted to the conventional DDR2 SDRAM in AL (additive latency)+CL (CAS latency) in synchronization with an internal clock. Herein, the AL and the CL are determined by a mode register set (MRS). Also, the MRS determines the burst type. For example, a burst type control signal seqb_int is generated based on the MRS. When the burst type control signal seqb_int is a logic low level, the burst type is the sequential method, or when the burst type control signal seqb_int is a logic high level, the burst type is the interleaving method.

Meanwhile, an internal clock generator included in the conventional DDR2 SDRAM generates an internal clock pulse signal dinclkp according to the write command.

Also, a plurality of data alignment blocks are included in the conventional DDR2 SDRAM. Each of the plurality of data alignment blocks receives four data sequentially inputted in synchronization with a rising edge and a falling edge of the clock signal and outputs the received four data in parallel in synchronization with the same clock. For example, a data inputted in synchronization with a rising edge of a first clock cycle is outputted as a first rising data din0r; a data inputted in synchronization with a falling edge of the first clock cycle is outputted as a first falling data din0f; a data inputted in synchronization with a rising edge of a second clock cycle is outputted as a second rising data din1r; and a data inputted in synchronization with a falling edge of the second clock cycle is outputted as a second falling data din1f.

FIG. 1 is a block diagram showing a data transferring path of the conventional DDR2 SDRAM for performing the write operation.

As shown, the conventional DDR2 SDRAM includes a data input control signal generator 100 for decoding the first and the second data input control code signals soseb0_wt and soseb1_wt to thereby generate a first to a fourth data input control signals soseb0wt<0> to soseb01wt<3>; a data input strobe signal generation unit 110 for generating a plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3 based on the internal clock pulse signal dinclkp, the burst type control signal seqb_int and the first to the fourth data input control signals soseb01wt<0> to soseb01wt<3>; and a data coding unit 120 for matching the data outputted from the plurality of data alignment blocks to the plurality of global input/output lines.

In detail, the data input strobe signal generator 110 includes a first and a second switching unit 111 and 112 and a first to a fourth data input strobe signal generators 113 to 116.

The first and the second switching unit 111 and 112 connect the second and the fourth data input control signals soseb01wt>1> and soseb01wt<3> to the first and the third data input strobe signal generators 113 and 115 respectively based on the burst type control signal seqb_int. Herein, when the burst type control signal seqb int is a logic low level, the first and the second switching unit 111 and 112 straightly connect the second and the fourth data input control signals soseb01wt<1> and soseb01wt<3> to the first and the third data input strobe signal generators 113 and 115. On the contrary, when the burst type control signal seqb_int is a logic high level, the first and the second switching unit 111 and 112 crossly connect the second and the fourth data input control signals soseb01wt<1> and soseb01wt<3> to the first and the third data input strobe signal generators 113 and 115. For example, when the burst type control signal seqb_int is a logic low level, the first switch 111 connects the fourth data input control signal soseb01wt<3> to a signal input terminal between a signal input terminal of the first data input control signal soseb01wt<0> and a signal input terminal of the third data input control signal seseb01wt<2> and connects the second data input control signal seseb01wt<1> to a signal input terminal below the signal input terminal of the third data input control signal soseb01wt<2>. When the burst type control signal seqb int is a logic high level, the fourth data input control signal soseb01wt<3> is connected to the signal input terminal below the signal input terminal of the third data input control signal seseb01wt<2> and the second data input control signal soseb01wt<1> is connected to the signal input terminal between the signal input terminal of the first data input control signal soseb01wt<0> and the signal input terminal of the third data input control signal seseb01wt<2>.

The first data input strobe signal generator 113 generates the data input strobe signals dinstb_r0_0, dinstb_f0_0, dinstb_r1_0, dinstb_f1_0 and dinstb_pcg_0 based on the internal clock pulse signal dinclkp, output signals of the first switching unit 111 and the first and the third data input control signals soseb01wt<0> and soseb01wt<2>.

When the internal clock pulse signal dinclkp pulses, the first data input strobe signal generator 113 outputs the data input strobe signal dinstb_r0_0 as a high pulse in synchronization with the internal clock pulse signal dinclkp if the first data input control signal soseb01wt is activated or outputs the data input strobe signal dinstb_r0_0 as a low level if the first data input control signal soseb01wt is inactivated. Similarly, the data input strobe signal dinstb_f0_0 is outputted as a high pulse in synchronization with the internal clock pulse signal dinclkp if the first output of the first switch 111 is activated or the data input strobe signal dinstb_f0 _0 is outputted as a low level if the first output of the first switch 111 is inactivated. Likewise, the data input strobe signal dinstb_r1_0 is outputted as a high pulse in synchronization with the internal clock pulse signal dinclkp if the third data input control signal soseb01wt<2> is activated or the data input strobe signal dinstb_r1_0 is outputted as a low level if the third data input control signal soseb01wt<2> is inactivated. Also, the data input strobe signal dinstb_f1_0 is outputted as a high pulse in synchronization with the internal clock pulse signal dinclkp if the second output of the first switching unit 111 is activated or the data input strobe signal dinsitb_f1_0 is outputted as a low level if the second output of the first switching unit is inactivated. The data input strobe signal dinstb_pcg_0 is outputted as a high pulse in synchronization with the internal clock pulse signal dinclkp.

The second data input strobe signal generator 114 generates the data input strobe signals dinstb_r0_1, dinstb_f0_1, dinstb_r1_1, dinstb_f1_1 and dinstb_pcg_1 based on the internal clock pulse signal dinclkp and the first to the fourth data input control signals soseb01wt<0> to soseb01wt<3>. Operations of the second data input strobe signal generator 114 are same to the above-mentioned operations of the first data input strobe signal generator 113.

The third data input strobe signal generator 115 generates the data input strobe signals dinstb_r0_2, dinstb_f0_2, dinstb_r1_2, dinstb_f1_2 and dinstb_pcg_2 based on the internal clock pulse signal dinclkp and output signals of the second switching unit 112. Operations of the second data input strobe signal generator 114 are same to the above-mentioned operations of the first data input strobe signal generator 113.

The fourth data input strobe signal generator 116 generates the data input strobe signals dinstb_r0_3, dinstb_f0_3, dinstb_r1_3, dinstb_f1_3 and dinstb_pcg_3 based on the internal clock pulse signal dinclkp and the first to the fourth data input control signals soseb01wt<0> to soseb01wt<3>. Operations of the second data input strobe signal generator 114 are same to the above-mentioned operations of the first data input strobe signal generator 113.

The data coding unit 120 includes a first to a fourth data coder 121 to 124.

The first data coder 121 outputs the first rising data din0r<0>, the first falling data din0f/21 0>, the second rising data din1r<0> and the second falling data din1f<0> to the first to the fourth global input/output lines gio_0<0> to gio_3<0> based on the plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3. Herein, the number between '<' and '>' denotes a number of the data pin.

The second data coder 122 outputs the first rising data din0r<1>, the first falling data din0f<1>, the second rising data din1r<1> and the second falling data din1f<1> to the first to the fourth global input/output lines gio_0<1> to gio_3<1> based on the plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3.

The third data coder 123 outputs the first rising data din0r<2>, the first falling data din0f<2>, the second rising data din1r<2> and the second falling data din1f<2> to the first to the fourth global input/output lines gio_0<2> to gio_3<2> based on the plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3.

The fourth data coder 124 outputs the first rising data din0r<3>, the first falling data din0f<3>, the second rising data din1r<3> and the second falling data din1f<3> to the first to the fourth global input/output lines gio_0<3> to gio_3<3> based on the plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3.

FIG. 2 is a block diagram showing the first data input strobe signal generator 113 shown in FIG. 1.

As shown, the first data input strobe signal generator 113 includes a data input strobe logic signal generator 201 and a data input strobe signal driver 202.

The data input strobe logic signal generator 201 receives the first data input control signal soseb01wt<0>, the first output of the first switching unit 111, the third data input control signal soseb01wt<2> and the second output of the first switching unit 111 to generate a first to a fifth logic signals n1 to n5. The data input strobe signal driver 202 receives the first to the fifth logic signals n1 to n5 to generate the data input strobe signals dinstb_r0_0, dinstb_f0_0, dinstb_r1_0, dinstb_f1_0 and dinstb_pcg_0. Herein, the data input strobe signal driver 202 includes a plurality of inverters having a large size.

The second to the fourth data input strobe signal generators 114 to 116 have the same structure with the first data input strobe signal generator 113.

FIG. 3 is a block diagram showing the first data coder 121.

As shown, the first data coder 121 includes a first to a fourth data input/output sense amplifier 331 to 334.

The first data input/output sense amplifier 331 receives the data input strobe signals dinstb_r0_0, dinstb_f0_0, dinstb_r1_0, dinstb_f1_0 and dinstb_pcg_0 as a first to a fifth control input signals respectively in order to output one of the first rising data din0r, the first falling data din0f, the second rising data din1r and the second falling data din1f to the first global input/output line gio_0.

The second data input/output sense amplifier 332 receives the data input strobe signals dinstb_r0_1, dinstb_f0_1, dinstb_r1_1, dinstb_f1_1 and dinstb_pcg_1 as the first to the fifth control input signals respectively in order to output one of the first rising data din0r, the first falling data din0f, the second rising data din1r and the second falling data din1f to the second global input/output line gio_1.

The third data input/output sense amplifier 333 receives the data input strobe signals dinstb_r0_2, dinstb_f0_2, dinstb_r1_2, dinstb_f1_2 and dinstb_pcg_2 as the first to the fifth control input signals respectively in order to output one of the first rising data din0r, the first falling data din0f, the second rising data din1r and the second falling data din1f to the third global input/output line gio_2.

The fourth data input/output sense amplifier 334 receives the data input strobe signals dinstb_r0_3, dinstb_f0_3, dinstb_r1_3, dinstb_f1_3 and dinstb_pcg_3 as the first to the fifth control input signals respectively in order to output one of the first rising data din0r, the first falling data din0f, the second rising data din1r and the second falling data din1f to the fourth global input/output line gio_3.

The first data input/output sense amplifier 331 amplifies the first rising data din0r and outputs the amplified first rising data to the first global input/output line gio_0 when the data input strobe signal dinstb_r0_0 is activated. Similarly, when the data input strobe signal dinstb_f0_0 is activated, the first falling data din0f is amplified and is outputted to the first global input/output line gio_0. When the data input strobe signal dinstb_r1_0 is activated, the second rising data din1r is amplified and is outputted to the first global input/output line gio_0. When the data input strobe signal dinstb_f1_0 is activated, the first data input/output sense amplifier 331 amplifies the second falling data din1f and outputs the amplified second falling data to the first global input/output line.

Operations of the second to the fourth data input/output sense amplifiers 332 to 334 are same to those of the first data input/output sense amplifier 331.

According to the prior art, the twenty data input strobe signals generated by the data input strobe signal generator 110 are commonly shared by each of the first to the fourth data coders 121 to 124. For example, in case of x16 DDR2 SDRAM, 16 data coders should share the twenty data input strobe signals since each data pin is connected to a different data coder. In case of a double data rate 3 synchronous dynamic random access memory (DDR3 SDRAM), 64 data coders are required since the DDR3 SDRAM performs an 8-bit prefetch operation.

Accordingly, each of signal lines of the data input strobe signals is required to be long having a length of thousands of micro-meters. Herein, generally, there are two different data lines in a semiconductor memory device: one is a global line and the other is a local line. The global input/output line is a kind of the global line, and the signal lines of the data input strobe signals are also a kind of the global line. In comparison with the local line, the global line is connected to more circuit units included in the semiconductor memory device and has a larger size. In addition, the global line and the local line are formed by different manufacturing methods. Therefore, if the number of global lines is increased, a size of the semiconductor memory device is increased. Accordingly, it is desired to reduce the number of global lines.

SUMMARY OF INVENTION

It is, therefore, an object of the present invention to provide a semiconductor memory device with reduced the number of signal lines.

In accordance with an aspect of the present invention, there is provided a semiconductor memory device for reducing data line length includes a plurality of data input strobe signal generation units each of which for generating a plurality of data input strobe signals based on a plurality of data input control code signals; and a plurality of data coders one-to-one corresponded to the plurality of data input strobe signal generation units for outputting data to a plurality of global input/output lines according to the plurality of data input strobe signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 4:
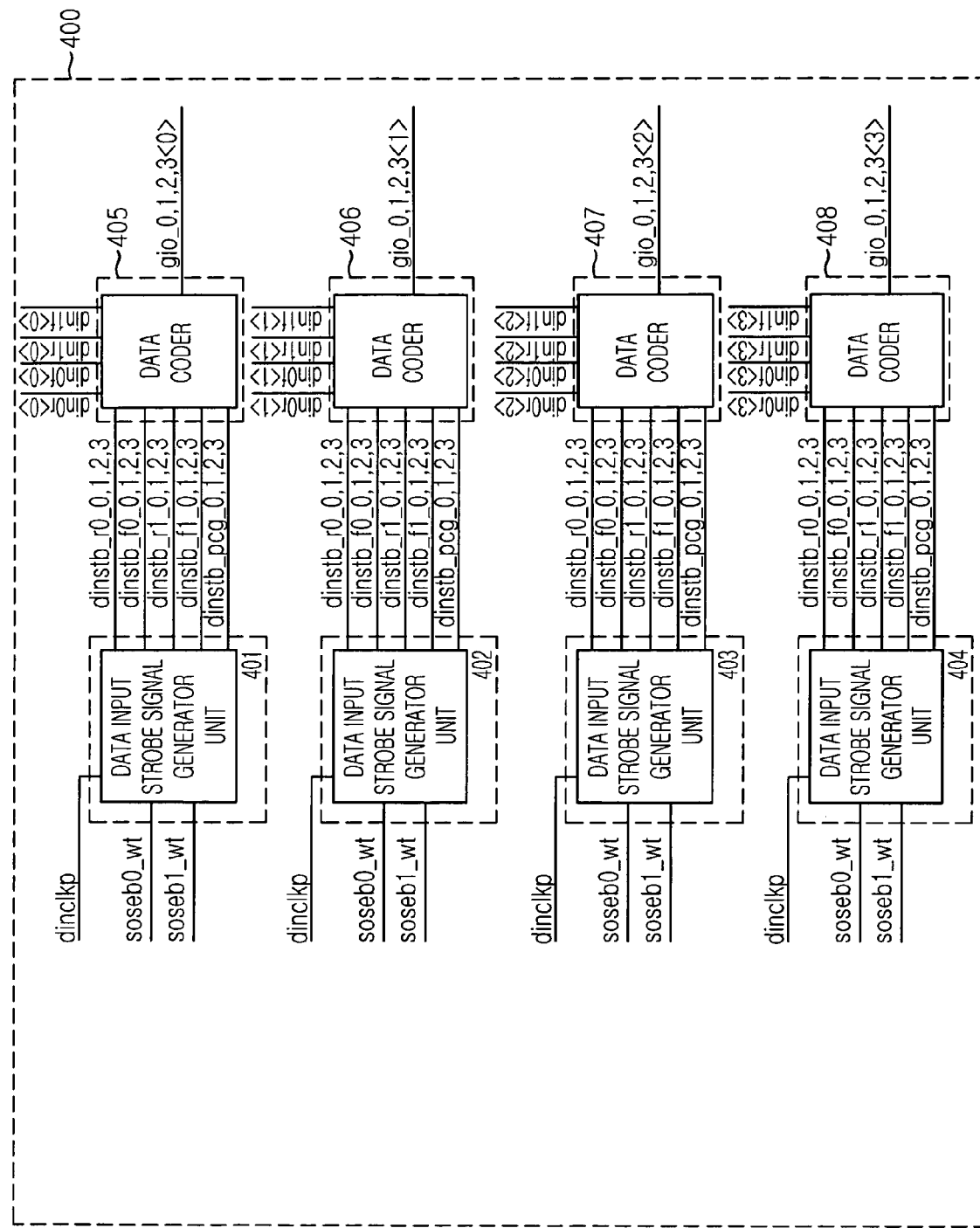
FIG. 4 is a block diagram showing a semiconductor memory device in accordance with a preferred embodiment of the present invention.

FIG. 4 is a block diagram showing a semiconductor memory device in accordance with a preferred embodiment of the present invention.

As shown, the semiconductor memory device includes a first to a fourth data input strobe signal generation units 401 to 404 for generating a plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3 based on an internal clock pulse signal dinclkp, a first data input control code signal soseb0_wt and a second data input control code signal soseb1_wt; and a first to a fourth data coders 405 to 408 for outputting a first rising data din0r, a first falling data din0f, a second rising data din1r and a second falling data din1f to a first to a fourth global input output lines gio_0 to gio_3 according to the plurality of data input strobe signals dinstb_r0_0 to dinstb_r0_3, dinstb_f0_0 to dinstb_f0_3, dinstb_r1_0 to dinstb_r1_3, dinstb_f1_0 to dinstb_f1_3 and dinstb_pcg_0 to dinstb_pcg_3.

Herein, as shown in FIG. 4, each of the first to the fourth data input strobe signal generation units 401 to 404 are respectively coupled to the corresponding one of the first to the fourth data coders 405 to 408.

Figure 1:
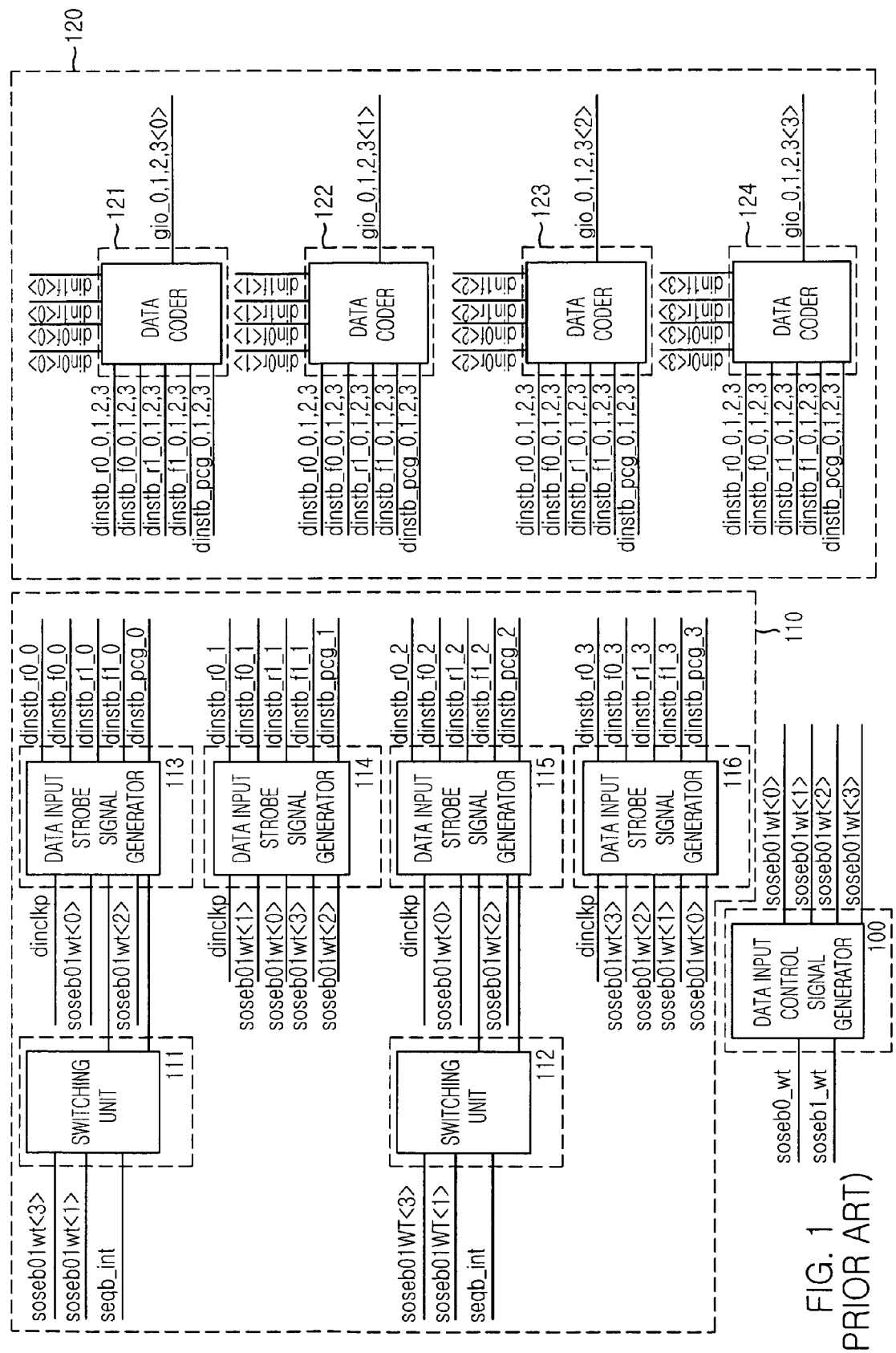
FIG. 1 is a block diagram showing a data transferring path of a conventional DDR2 SDRAM for performing a write operation.
Figure 2:
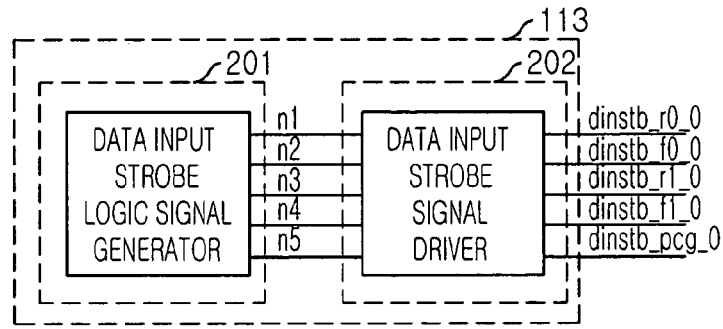
FIG. 2 is a block diagram showing a first data input strobe signal generator shown in FIG. 1.
Figure 3:
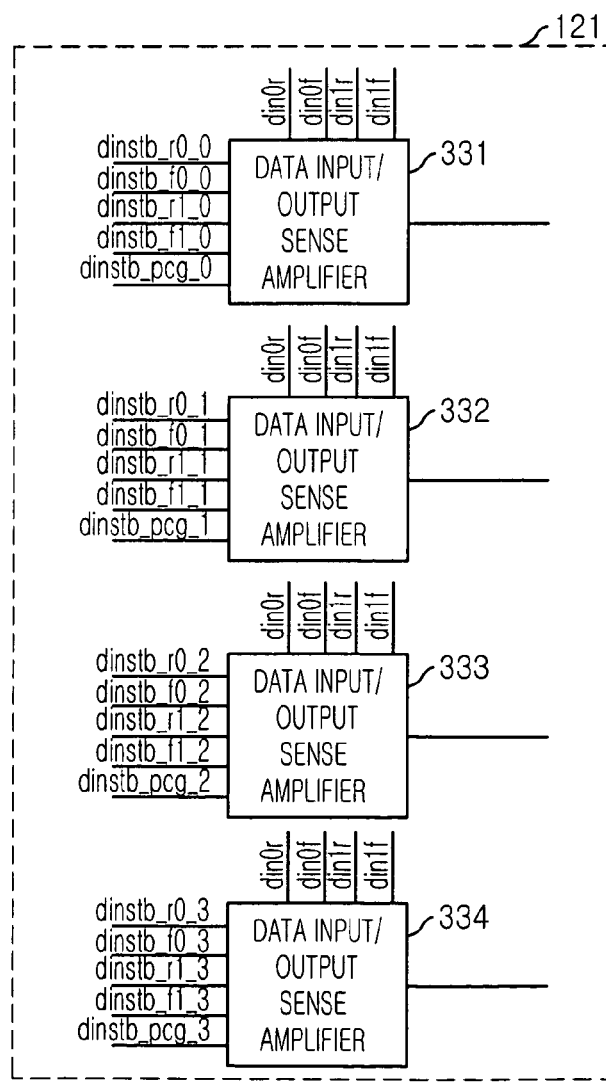
FIG. 3 is a block diagram showing a first data coder shown in FIG. 1.

Each of the first to the fourth data input strobe signal generators 401 to 404 includes the data input control signal generator 100 shown in FIG. 1, which obtains the data input control signal based on an additive latency (AL) and a column address strobe (CAS) latency, and the data input strobe signal generator 110 shown in FIG. 1.

Therefore, each of the first to the fourth data input strobe signal generation units 401 to 404 generates all of the plurality of data input strobe signals to be inputted for controlling a corresponding data coder.

Herein, it is preferable that a distance between a data input strobe signal generator and a corresponded data coder is minimized.

In comparison with the prior art, the data input strobe signals are not shared by the data coders. Also, signal lines of the data input strobe signals are formed as local lines. Therefore, a size required for the signal lines of the data input strobe signals to the data coders is reduced.

Although the semiconductor memory device described above includes four data coders, the semiconductor memory device can include more than four data coders, e.g., 16 data coders.

In accordance with the present invention, in case that the semiconductor memory device includes 16 data coders, 16 data input strobe signal generation units are one-to-one corresponded to the 16 data coders.

Also, the present invention can be applied to a DDR3 SDRAM which requires 64 data coders since the DDR3 SDRAM performs an 8-bit prefetch operation. Further, the present invention can be applied to various semiconductor memory device which perform a 16-bit or 32-bit prefetch operation.

Therefore, in accordance with the present invention, a size of a semiconductor memory device can be reduced. Accordingly, a power consumption also can be reduced.

The present application contains subject matter related to Korean patent application No. 2004-87326, filed in the Korean Patent Office on Oct. 29, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for reducing data line length, comprising:

a plurality of data input strobe signal generation units, each for generating a plurality of data input strobe signals in response to a plurality of data input control code signals obtained based on an additive latency (AL) and a column address strobe (CAS) latency; and a plurality of data coders, coupled to corresponding each data input strobe signal generation unit for outputting data to a plurality of global input/output lines according to the plurality of data input strobe signals, wherein all of the data input strobe signals outputted from one data input strobe signal generation unit are inputted to a corresponding data coder.

2. The semiconductor memory device as recited in claim 1, wherein each of the plurality of data input strobe signal generation units includes:

a data input control signal generator for decoding the plurality of data input control code signals to generate a plurality of data input control signals; and a data input strobe signal generator for generating the plurality of data input strobe signals according to the plurality of data input control signals, a burst type control signal and an internal clock pulse signal.

3. The semiconductor memory device as recited in claim 2, wherein a distance between one of the plurality of data input strobe signal generation units and a corresponded data coder is minimized.

4. The semiconductor memory device as recited in claim 3, wherein the burst type control signal is determined by a mode register set (MRS).

5. The semiconductor memory device as recited in claim 4, further comprising:

a data input control code signal generator for generating the plurality of data input control code signals in synchronization with a clock signal according to the column address strobe (CAS) latency and the additive latency (AL).

6. The semiconductor memory device as recited in claim 5, wherein the number of the plurality of data input strobe signals is 16.

7. The semiconductor memory device as recited in claim 6, wherein plural-bit prefetch operation is performed by the semiconductor memory device.

* * * * *